United States Patent [19]
Coad et al.

[11] Patent Number: 5,212,580
[45] Date of Patent: May 18, 1993

[54] LOW COST STAGE FOR RASTER SCANNING OF SEMICONDUCTOR WAFERS

[75] Inventors: George L. Coad, LaFayette; James B. Stolz, Milpitas; Yung C. Lee, Cupertino; Ron B. Whitney, Redwood City; Peter G. Borden, San Mateo; Mark A. Nokes, Palo Alto, all of Calif.

[73] Assignee: High Yield Technology, Sunnyvale, Calif.

[21] Appl. No.: 836,039

[22] Filed: Feb. 12, 1992

[51] Int. Cl.$^5$ .............................................. G02B 26/08
[52] U.S. Cl. .................................... 359/196; 359/209; 359/379; 359/391
[58] Field of Search ............... 359/196, 198, 197, 199, 359/824, 209, 379, 391, 392; 128/660.09, 660.1

[56] References Cited
U.S. PATENT DOCUMENTS

| | | | |
|---|---|---|---|
| 2,968,994 | 1/1961 | Shurcliff | 359/392 |
| 4,012,111 | 3/1977 | Masterson | 359/391 |
| 4,092,867 | 6/1978 | Matzuk | 73/609 |
| 4,537,477 | 8/1985 | Takagi et al. | 359/391 |
| 4,807,984 | 2/1989 | Kurimura et al. | 359/391 |
| 4,832,474 | 5/1989 | Yoshinaga et al. | 359/392 |
| 4,920,053 | 4/1990 | Inoke et al. | 359/391 |
| 5,144,478 | 9/1992 | Toshimitsu | 359/391 |

Primary Examiner—Loha Ben
Attorney, Agent, or Firm—Skjerven, Morrill, MacPherson, Franklin & Friel

[57] ABSTRACT

A raster scan apparatus provides a scanning assembly capable of moving in a sinusoidal motion along a first direction and stepping in fine steps in a second direction perpendicular to the first direction. In one embodiment, a piezoelectric bimorph sets in scanning motion a scanning assembly formed by a wafer holder and leaf springs. The amplitude of the scanning motion is controlled by a voltage applied across the piezoelectric bimorph. A Hall effect sensor provides an output signal indicating the instantaneous location of the scanning assembly in motion. The output signal of the Hall effect sensor is compared against a predetermined threshold to provide a trigger signal for synchronization. The output signal of the Hall effect sensor is also fed back to the source of sinusoidal voltage to adaptively adjust the sinusoidal voltage so as to achieve a predetermined amplitude for the scanning motion.

18 Claims, 3 Drawing Sheets

LOW COST STAGE FOR RASTER SCANNING OF SEMICONDUCTOR WAFERS

FIELD OF THE INVENTION

This invention relates to equipment requiring a movable stage, and in particular, relates to equipment requiring a movable stage for scanning motion back and forth along one axis.

BACKGROUND OF THE INVENTION

Certain inspection equipment performs raster scans on semiconductor wafers. An example of such inspection equipment is a confocal microscope-a kind of microscope which focus is fixed during operation. A confocal microscope can obtain enhanced optical quality if the optical system is fixed and the specimen under inspection is made to move with respect to the optical system. Thus, during operation, the movement of the specimen allows a designated area of the specimen to be scanned by the fixed optical focus. FIG. 1 shows part of an implementation of such a confocal microscope 100 with a samiconductor wafer specimen 104.

As shown in FIG. 1, light is transmitted through lens 102 and focussed on to a point 103 inside a semiconductor wafer 104. Semiconductor wafer 104 is shown in FIG. 1 as a cross section. From focal point 103, the transmitted light diverges and leaves the semiconductor wafer 104 before being transmitted by lens 105 to the signal processing system (not shown) of confocal microscope 100.

Confocal microscope 100 operates in transmission, i.e. the light used is chosen from a range of wavelengths at which semiconductor wafer 104 is transparent. For a silicon wafer, one such wavelength is 1.3 microns.

In one inspection application, one narrow section of semiconductor wafer 104 is scanned in a plane perpendicular to the surface of the wafer. To achieve this raster scan, the stage is moved through a number of fine steps in the vertical direction, so that focal point 103 of confocal microscope 100 moves through various depths in semiconductor wafer 104. At each step, semiconductor wafer 104 is moved back and forth along an axis parallel to the semiconductor wafer surface. The optical signal transmitted through the semiconductor wafer is provided to form a raster scan image.

For this technique to work, it is necessary that the wafer is scanned back and forth along a plane parallel to the semiconductor surface in a rapid, smooth and reproducible manner.

SUMMARY OF THE INVENTION

In accordance with the present invention, a structure and a method are provided to achieve a scanning stage for raster scanning a specimen, such as a semiconductor wafer. In one embodiment, a wafer holder is supported by leaf springs mounted on a translation stage. The wafer holder and the leaf springs form a scanning assembly capable of moving in a scanning direction, which is perpendicular to each of the directions in which the translation stage can move in fine steps.

In one embodiment, the scanning assembly can be set in sinusoidal motion by applying a sinusoidal voltage across a piezoelectric bimorph which is connected to the scanning assembly at one end and a fixed position with respect to the translation stage at the other end. A Hall effect sensor provides an output signal indicative of the instantaneous location of the scanning assembly in motion. The output signal of the Hall effect sensor is compared to a predetermined threshold to provide a trigger signal for synchronization when the predetermined threshold is reached.

In one embodiment, the output signal of the Hall effect sensor is subtracted from a scan reference signal to provide a difference signal indicative of the amount the amplitude of the scanning motion deviated from a predetermined amplitude. This difference signal is fed back to an automatic gain control (AGC) circuit to adjust the sinusoidal voltage across the piezoelectric bimorph in order to achieve the predetermined scanning amplitude.

The scanning stage provided in accordance with the present invention maintains constant motion amplitude under a wide range of operating conditions, such as variations in stage dimensions due to temperature effects, or variations in the resonant frequency of the scanning assembly due to varying weights of the wafer specimens.

Because of the relatively simple construction of the scanning stage, the scanning stage of the present invention can be provided at low cost. Further, because the motion of the scanning stage is provided independent of the translation stage, a low cost stable translation stage can be used, thereby significantly reduce the total cost of the confocal microscope.

The present invention is better understood upon consideration of the following detailed description and the accompanying drawings.

DETAILED DESCRIPTION OF THE PREFERRED EMBODIMENTS

The present invention provides a scanning stage suitable for use in an application requiring a rapid scanning motion, such as the scanning motion required for an optical inspection of a semiconductor wafer using a confocal microscope.

Figure 1:
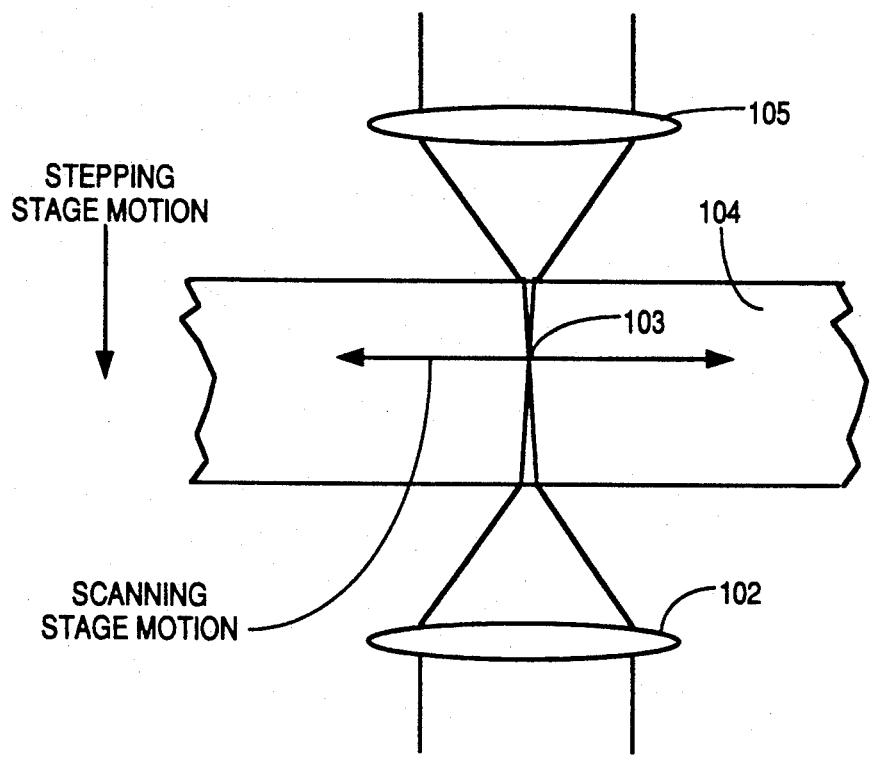
FIG. 1 shows lens 102 and 105 of confocal microscope 100 with a semiconductor specimen 104.
Figure 2:
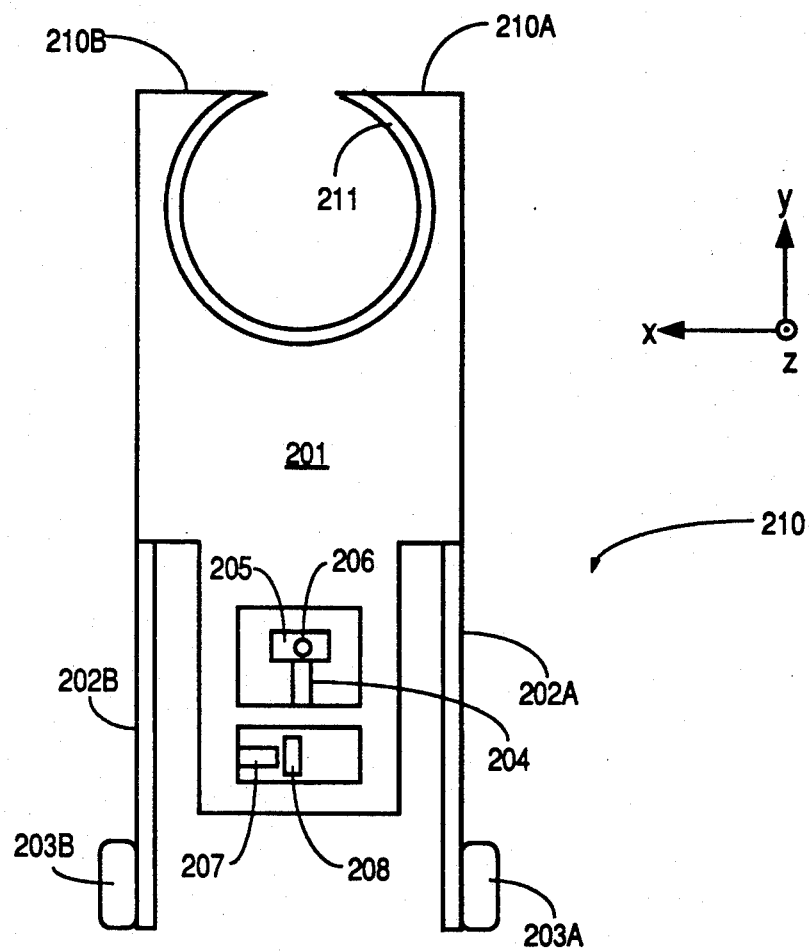
FIG. 2 is a top view of a scanning assembly 210, in accordance with the present invention.

An embodiment of the present invention is shown in FIG. 2. As shown in FIG. 2, a moving stage has a "fork-shaped" wafer holder 201 designed to hold a semiconductor wafer between the two tines 201a and 201b. The present embodiment is made from a 3/16" aluminum plate, although any suitable material can also be used. A ring shape recess 211 is provided on wafer holder 201 between tines 201a and 201b to accommodate the semiconductor wafer. The diameter of the ring shape recess is selected to accommodate the largest semiconductor wafer to be scanned. An alignment flat or pin can also be provided in recess 211 to hold the semiconductor wafer in a conventional fixed orientation.

Although ring shape recess 211 of wafer holder 201 is designed to accommodate the largest wafer to be scanned, semiconductor wafer of smaller diameters can also be accommodated through the use of inserts of various sizes. An insert is a thin annular ring made of a suitable material, such as plastic or aluminum. In such an insert, the outer diameter of the insert conforms to the ring shape recess of wafer holder 201. A cut-out and a ledge are provided in the inner edge of the insert so as to accommodate a semiconductor wafer having a diameter equal to the cut-out diameter of the insert.

As shown in FIG. 2, wafer holder 201 is mounted on two leaf springs 202a and 202b. Leaf springs 202a and 202b each connect to wafer holder 201 at one end and one of mounting brackets 203a and 203b at the other end. Wafer holder 201, leaf springs 202a and 202b, and mounting brackets 203a and 203b form scanning assembly 210. Mounting brackets 203a and 203b are mounted onto a translation stage (not shown) which can move scanning assembly 210 in fine steps along an axis z perpendicular to the semiconductor wafer surface, and along the axis y, as indicated in FIG. 2.

Scanning assembly 210 is designed as a resonant system that moves in a smooth sinusoidal motion along the x axis in a plane parallel to the wafer surface. In one application, the resonant frequency is approximately 10 Hz, which is achieved by appropriately choosing both the leaf springs and the mass of scanning assembly 210. In that application, the sinusoidal motion has an amplitude of 500 microns along the x-axis, so as to provide several hundred microns of linear motion about the mid-point of the scan.

A piezoelectric bimorph, shown in FIG. 2 as bimorph 204, provides in this embodiment a smooth and constant motion in the scanning assembly. To achieve this purpose, bimorph 204, which is a 1.5"×0.5" thin sheet of piezoelectric material, such as PZT (lead zirconium titanate ceramics) is attached at one end to wafer holder 201 and at the other end firmly fixed to clamp 205. In this embodiment, clamp 205 has a hole through which pin 206 is fitted loosely. Pin 206 is held to a base plate (not shown) of the translation stage beneath the scanning assembly. Bimorph 204 is metallized on both sides.

When a sinusoidal voltage is applied across bimorph 204, bimorph 204 vibrates at the frequency of the sinusoidal voltage. When this frequency is at or about the resonant frequency of the scanning assembly 210, scanning assembly 210 is driven back and forth in a steady scanning motion along the x axis. The amplitude of the scanning motion is a function of both the frequency and the amplitude of the driving sinusoidal voltage.

In order to track the position of scanning assembly 210, both for controlling the amplitude of the scanning motion and for providing a trigger signal useful for other equipment to synchronize with the scanning motion, magnet 207 is mounted on the scanning assembly 210. Magnet 207 is used in conjunction with Hall effect sensor 208, which is held in a position in close proximity (e.g. 30 mils) of magnet 207 and is fixed with respect to the translation stage. A suitable means for mounting Hall effect sensor 208 stationary with respect to the translation stage is the same base plate on which pin 206 is also mounted. Hall effect sensor 208 provides a voltage proportional to its distance from magnet 207.

Figure 3:
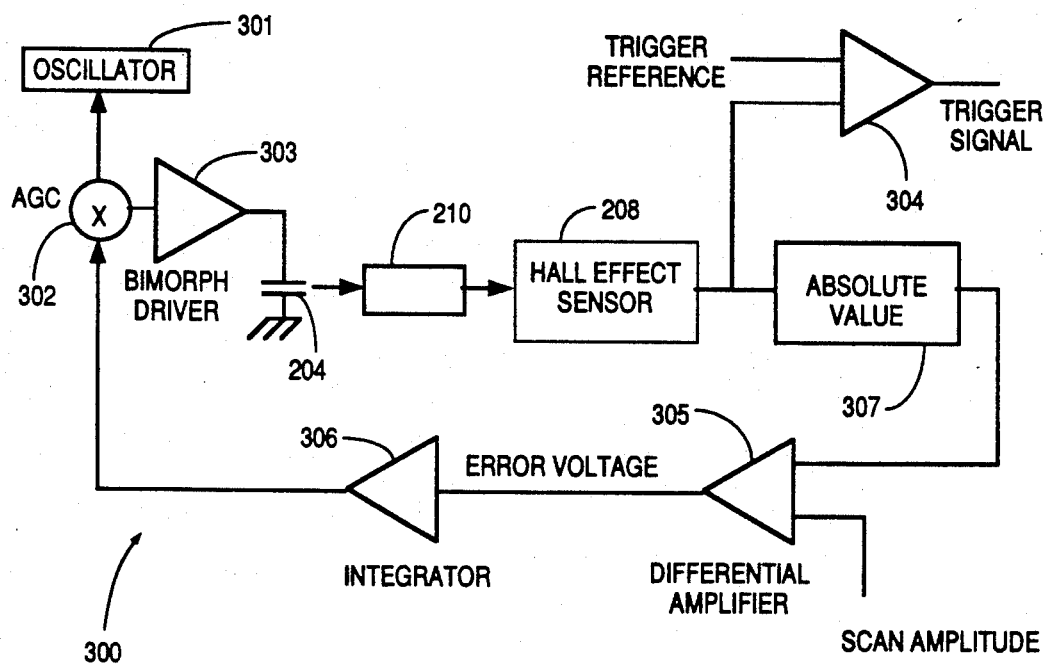
FIG. 3 is a circuit for controlling the scanning movement of scanning assembly 210, in accordance with the present invention.

A block diagram of circuit 300 which controls the amplitude of the scanning motion and provides a trigger signal is shown in FIG. 3. As shown in FIG. 3, oscillator 301 provides a sinusoidal signal to an automatic gain control (AGC) circuit 302, which in turn controls through amplifier 303 a sinusoidal voltage applied across bimorph 204. In the manner described above, scanning assembly 210 is set into motion by the oscillation of bimorph 204, thereby causing a varying voltage in Hall effect sensor 208 tracking the scanning motion of scanning assembly 210. This varying voltage in Hall effect sensor 208 is compared by comparator 304 to a reference voltage so as to provide a trigger signal once per cycle of the scanning motion. The magnitude of this varying voltage in Hall effect sensor 208 is provided through a rectifying circuit 307 to differential amplifier 305, which also receives a scan amplitude reference signal. Differential amplifier 305 provides a difference or error signal proportional to the difference between the magnitudes of the varying voltage in Hall affect sensor 208 and the scan amplitude reference signal. Integrator 306 integrates this difference signal to provide an output signal proportional to an average value of the difference signal. This average value is fed back to automatic gain control circuit 302, for adaptively varying the amplitude of the sinusoidal voltage across bimorph 204. The sign and magnitude of the average value provided by integrator 306 is indicative of the difference between the amplitude of the actual scanning motion and the desirable scan amplitude represented by the scan amplitude reference signal provided to differential amplifier 305.

Because of the feedback path between Hall effect sensor 208 and AGC circuit 302, circuit 300 provides automatic and adaptive compensation to ensure that a predetermined scanning amplitude is achieved in scanning assembly 210 under a wide range of operating conditions. Variations in operating condition may result from temperature variations affecting the dimensions of the scanning stage, which in turn affects the resonant frequency of scanning assembly 210. A variation in the resonant frequency requires a different driving sinusoidal voltage to achieve a predetermined amplitude of scanning motion.

To scan an area in a plane (x-z) perpendicular to the surface of the wafer, the translation stage moves the scanning assembly through a number of steps along the z axis, each step separated by a small distance. At each step, scanning assembly 210 is set into scanning motion along the x axis. Thus, an area in the wafer in the x-z plane perpendicular to the wafer surface can be raster scanned.

Alternatively, the present embodiment can be used to provide a raster scan of an area in the wafer in the x-y plane parallel to the wafer surface. To achieve this raster scan, instead of fine stepping through a number of steps in along the z axis perpendicular to the wafer surface, the translation stage moves through a number of fine steps along the y axis parallel to the wafer surface and perpendicular to scanning motion along the x axis.

The above detailed description is provided to illustrate the specific embodiments, and is not intended to be limiting the present invention. Numerous modifications and variations are possible within the scope of the present invention. The present invention is defined by the following claims.

We claim:

1. A structure for raster scanning, comprising:
   a stage capable of moving in a direction perpendicular to a scanning direction;
   means for accommodating a specimen for scanning;
   leaf springs means connecting said specimen accommodating means and said stage such that said leaf springs means and said means for accommodating a specimen form an assembly capable of moving in said scanning direction; and means for setting said assembly in motion back and forth along said scanning direction in a sinusoidal manner.

2. A structure as in claim 1, wherein said means for accommodating a specimen accommodates specimens of various sizes using inserts of corresponding sizes.

3. A structure as in claim 1, wherein said means for setting said assembly in motion comprises a piezoelectric bimorph driven by a sinusoidal voltage, connected to said assembly such that the amplitude of the motion of said assembly varies according to the amplitude of said sinusoidal voltage.

4. A structure as in claim 3, further comprises:
means for sensing the location of said assembly in motion and for providing an output signal indicative of said location; and
means for comparing the magnitude of said output signal of said means for sensing to the magnitude of a predetermined signal and for adjusting accordingly the amplitude of said sinusoidal voltage.

5. A structure as in claim 4, wherein said means for sensing comprises a Hall effect sensor.

6. A structure as in claim 4, wherein said means for comparing comprises:
differential amplifier for providing a difference signal proportional to the difference between said predetermined signal and said output signal; and
integrator means for integrating said difference signal.

7. A structure as in claim 3, wherein said means for setting said assembly in motion comprises:
oscillator means for providing a sinusoidal signal at a frequency; and
amplifier means for providing a sinusoidal voltage at said frequency.

8. A structure as in claim 7, wherein said amplifier means comprises an automatic gain control circuit.

9. A structure as in claim 3, further comprises:
means for sensing the location of said assembly in motion and for providing an output signal indicative of said location; and
means for comparing said output signal to a predetermined threshold and for providing a trigger signal for synchronization when said output signal reaches said predetermined threshold.

10. A method for providing a stage for raster scanning, comprising the steps of:
providing a stage capable of moving in a direction perpendicular to a scanning direction;
providing means for accommodating a specimen for scanning;
providing leaf springs means connecting said specimen accommodating means and said stage such that said leaf springs means and said means for accommodating a specimen form an assembly capable of moving in said scanning direction; and
providing means for setting said assembly in motion back and forth along said scanning direction in a sinusoidal manner.

11. A method as in claim 10, wherein said step of providing means for accommodating a specimen provides means for accommodating specimens of various sizes using inserts of corresponding sizes.

12. A method as in claim 11, wherein said step of providing means for setting said assembly in motion comprises the step of providing a piezoelectric bimorph driven by a sinusoidal voltage, connected to said assembly such that the amplitude of the motion of said assembly varies according to the amplitude of said sinusoidal voltage.

13. A method as in claim 12, further comprises the steps of:
sensing the location of said assembly in motion for providing an output signal indicative of said location; and
comparing the magnitude of said output signal of said step of sensing to the magnitude of a predetermined signal and adjusting accordingly the amplitude of said sinusoidal voltage.

14. A method as in claim 13, wherein said sensing step comprises the step of using a Hall effect sensor.

15. A method as in claim 13, wherein said step of comparing comprises the steps of:
providing a difference signal proportional to the difference between said predetermined signal and said output signal; and
integrating said difference signal.

16. A method as in claim 12, wherein said step of providing means for setting said assembly in motion comprises the steps of:
providing a sinusoidal signal of at a frequency; and
providing a sinusoidal voltage at said frequency.

17. A method as in claim 16, wherein said step of providing a sinusoidal voltage comprises the step of using an automatic gain control circuit.

18. A method as in claim 12, further comprises the steps of:
providing means for sensing the location of said assembly in motion and for providing an output signal indicative of said location; and
providing means for comparing said output signal to a predetermined threshold and for providing a trigger signal for synchronization when said output signal reaches said predetermined threshold.

* * * * *